United States Patent [19]
Whitmarsh et al.

[11] Patent Number: 5,381,108
[45] Date of Patent: Jan. 10, 1995

[54] AUTOMATIC CALIBRATION OF THE QUADRATURE BALANCE WITHIN A CARTESIAN AMPLIFIER

[75] Inventors: William J. Whitmarsh, Bristol; Simon M. Whittle, Bath; Ian S. Parry, Richmond, all of United Kingdom

[73] Assignee: Linear Modulation Technology Limited, Bath, United Kingdom

[21] Appl. No.: 152,983

[22] Filed: Nov. 15, 1993

[30] Foreign Application Priority Data

Nov. 16, 1992 [GB] United Kingdom ............... 9224032
Aug. 2, 1993 [GB] United Kingdom ............... 9315985

[51] Int. Cl.$^6$ ............................................. H03F 1/34
[52] U.S. Cl. .......................................... 330/2; 330/107
[58] Field of Search ............... 330/2, 107, 109, 149; 332/103; 455/115, 126

[56] References Cited

U.S. PATENT DOCUMENTS 5,049,832  9/1991  Cavers ................................. 330/149
5,066,923  11/1991  Gailus et al. ......................... 330/107
5,105,446  4/1992  Ravoalavoson et al. ......... 330/149 X

FOREIGN PATENT DOCUMENTS 2265269  9/1993  United Kingdom .
9318602  9/1993  WIPO .

OTHER PUBLICATIONS

A. Bateman, R. J. Wilkinson and J. D. Marvill: The Application Of Digital Signal Processing To Transmitter Linearisation, dated 1988, 4 pages.

Primary Examiner—Steven Mottola
Attorney, Agent, or Firm—Harness, Dickey & Pierce

[57] ABSTRACT

A Cartesian amplifier in which an input signal is pre-processed and split into two quadrature components. Both quadrature components are passed, in parallel, through an error amplifier (4), after which they are re-combined and up-converted to RF. The output of the amplifier is used to provide a feedback signal. This feedback is downconverted from RF to baseband and resolved into two quadrature components which are fed to the respective inputs of the error amplifier (4). Periodically the pre-processor (3) is switched into a calibration mode in which test signals are applied to the amplifier instead of the input signal. At these times the signal strength of the output of the power amplifier is measured and used to provide pre-distortion factors in the signal preprocessor (3) to improve amplifier linearity.

16 Claims, 6 Drawing Sheets

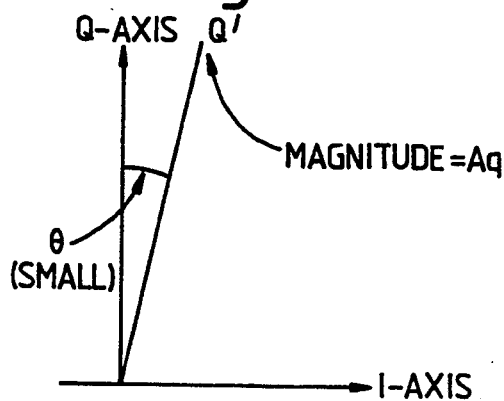
Fig. 12.
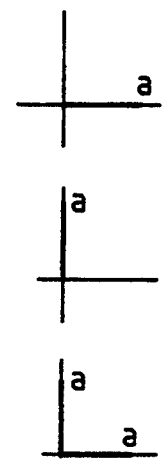
Fig. 14.
Fig. 15.
Fig. 16.
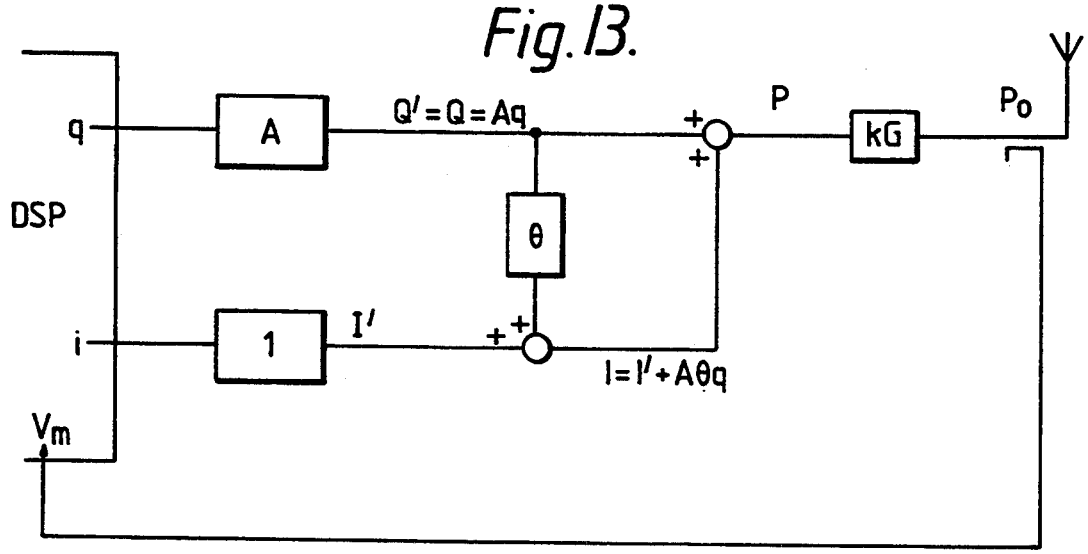
Fig. 13.
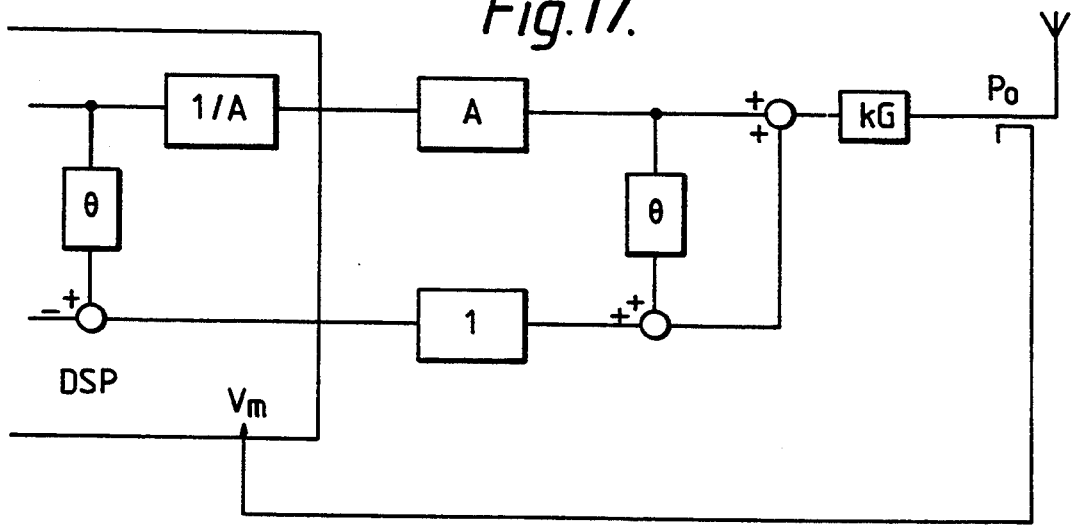
Fig. 17.

AUTOMATIC CALIBRATION OF THE QUADRATURE BALANCE WITHIN A CARTESIAN AMPLIFIER

The present invention relates to amplifiers, in particular of the type used in RF transmitters and concerns the implementation of the so-called Cartesian loop feedback technique to improve the linearity of such amplifiers.

Linear amplification of an RF signal in a transmitter can be achieved using conventional device technology, though the resulting circuits are generally inefficient and costly. Better performance can be achieved using one of a variety of amplifier linearisation techniques acting on a more non-linear device. Such linearisation is possible using both feedforward and feedback techniques. The Cartesian loop provides a straightforward method of linearisation, using feedback.

Typically in an amplifier not using Cartesian feedback, linearisation may be sought by treating the amplified signal as exhibiting a phase error and an amplitude error, and then applying phase and amplitude corrections (whether by feed-back or feed-forward techniques) to reduce these errors. A Cartesian amplifier on the other hand treats the signal being amplified as the sum of two quadrature components, to which individual corrections are applied. To derive these corrections a Cartesian loop amplifier uses feedback to baseband, with the demodulated signal resolved into real and imaginary (quadrature) components. An error amplifier is implemented at baseband in two parallel parts (providing one path for the "real" component and one for the "imaginary" component). The loop can be implemented using direct conversion to and from RF, or using multiple conversions via intermediate frequencies (IF) in both the up-converter and down-converter.

A drive signal is applied to the Cartesian loop at baseband via the error amplifier. This is conventionally applied as a quadrature signal which is easily generated using digital signal processing (DSP). The outputs of the two paths in the error amplifier are applied to a quadrature up-converter which translates to either an IF or the final RF frequency. If necessary, the resulting signal is finally translated to RF and applied to the RF amplifier that is being linearised.

A directional coupler is used to obtain a small sample of the transmit signal fed to the antenna. This feedback signal is fed to a quadrature down-converter that yields a pair of baseband signals which are applied to the error amplifier to be compared with the original drive signal.

By careful selection of the various gains within the loop and the frequency response of the error amplifier, significant improvements in amplifier linearity can be achieved. The loop can exhibit instability if the delay from the error amplifier, around the loop and back to the error amplifier is sufficient to cause a phase shift that results in positive feedback. This is solved by using a phase shifter on the quadrature local oscillator which allows additional phase to be added in the up-converter to compensate for the loop delay.

One drawback in the use of a Cartesian amplifier is that an error in the quadrature matching can occur at various points in the circuit. This is predominantly due to inaccuracies in the down-converter devices. Any imbalance in gain between the two quadrature paths, or in the phase of the signals passing through the two quadrature paths will cause this effect. The result is that distortions can occur in the RF signal that appears at the output.

FIG. 3 of the accompanying drawings shows the effect of such distortion on a single tone that is to be transmitted on one side of the nominal carrier frequency. The quadrature up-conversion would ideally allow perfect single sideband frequency translation to occur. However, the effect of quadrature mismatch is to cause the unwanted image sideband to appear on the other side of the carrier to the wanted tone. Equivalent distortions occur if the wanted signal is more complex than a single sinusoid.

With careful manual adjustment of the amplitude and phase balances, it is possible to obtain a high level of sideband rejection. However, ageing, drift, temperature changes and alterations in the RF frequency will reduce the suppression to unacceptable levels.

The present invention is concerned with a technique for adaptively predistorting the drive signal to the Cartesian amplifier so as to improve linearity and is based upon the realisation that suitable predistortion factors can be calculated using surprisingly simple test signals and measurements. As applied to RF power amplification the technique involves a calibration procedure, which may be implemented using a Digital Signal Processor (DSP), that is either carried out periodically during transmission or prior to transmission depending on the total transmit time.

According to the present invention, there is provided a Cartesian amplifier system comprising:
 a) an input for a signal to be amplified;
 b) a power amplifier for amplifying the input signal;
 c) a Cartesian loop feedback circuitry around the power amplifier having a pair of channels for processing "real" and "imaginary" quadrature signal components and being arranged to drive the power amplifier with a signal derived from the sum of real and imaginary signals from the respective outputs of forward paths of those channels, the Cartesian loop comprising, or being associated with,
 d) a signal pre-processor for pre-distorting resolved real and/or imaginary components of the input signal in accordance with the value of at least one predistortion factor;
  wherein the amplifier system is operative in a first, normal mode to amplify the input signal and a second, calibration mode to apply test signals to drive the Cartesian loop in place of the input signal and wherein
 e) the amplifier system comprises means for measuring the response of the Cartesian loop to the test signals and for calculating and setting the value of the, or each, predistortion factor, the response of the Cartesian loop being measured by measuring the signal strength at the output of the power amplifier while the system is operated in the second, calibration mode.

The invention can readily be applied to the case of a Cartesian loop around an RF power amplifier; thus a subsidiary aspect of the invention provides an amplifier system in which the power amplifier is an RF power amplifier and the Cartesian loop includes an error amplifier for a pair of channels for amplifying the differences between i) the real components and imaginary components, respectively of the resolved input signal, at baseband, from the pre-processor and ii) respective feedback signals, a frequency up-converter for converting the outputs of real and imaginary channels of the error amplifier to RF to drive the power amplifier, a frequency down-converter for frequency downconverting the output of the power amplifier to baseband, and means for resolving the downconverted output of the power amplifier into real and imaginary components to obtain the respective feedback signals to be applied to the inputs of the error amplifier.

In that case an implementation of the invention can provide a ready means of compensating for quadrature imbalance in the I & Q feedback channels.

As will become apparent from the following description, the test signals preferably comprise, and conveniently consist of, simple combinations of DC test signals (voltages of predetermined levels including zero). These can easily be used to derive a pair of suitable predistortion factors to compensate for gain and phase mismatch between the two quadrature channels.

These factors may be:

1) A factor $1/A$, which compensates for gain mismatch between the two quadrature paths through the amplifier; and 2) A factor $(-\sin \theta)/A$, which compensates for relative phase shift occurring between the two quadrature paths through the amplifier.

In one embodiment of the invention, described below, the factors are calculated from the results of applying five distinct test signals. In a second embodiment, just three test signals are used.

The invention will be further described by way of non-limitative example with reference to the accompanying drawings, in which.

Figure 1:
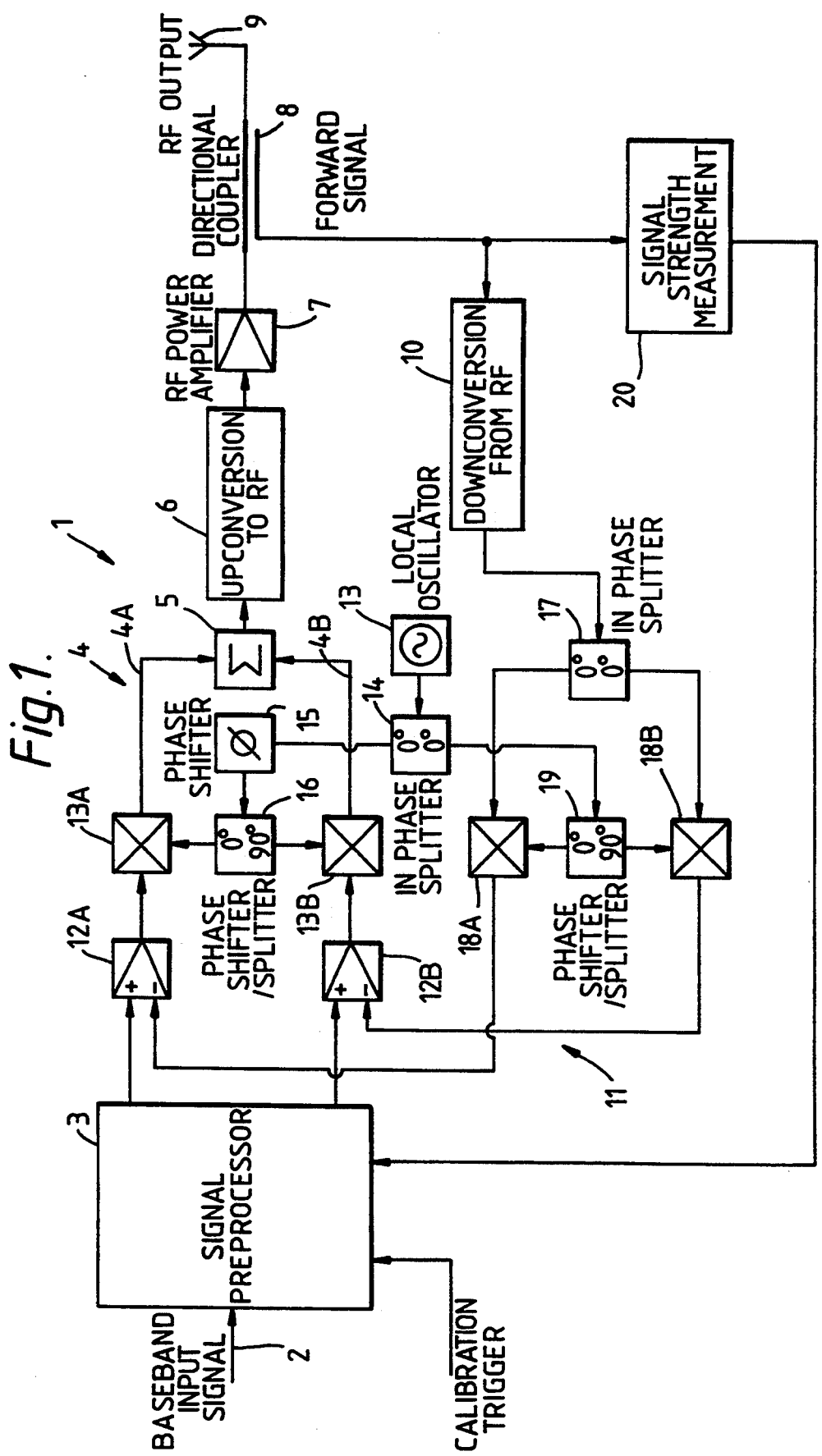
FIG. 1 is an overall block diagram of a Cartesian loop amplifier embodying the present invention.
Figure 4:
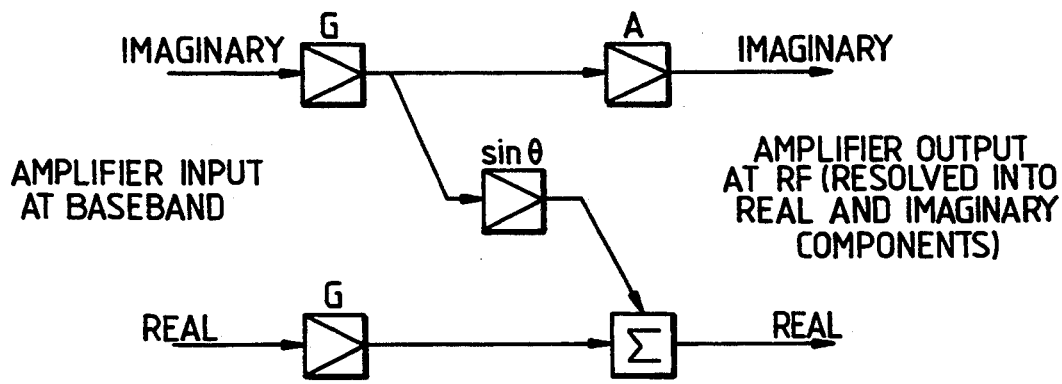
FIG. 4 is an equivalent circuit representation of gain and phase mismatch in a Cartesian amplifier.
Figure 5:
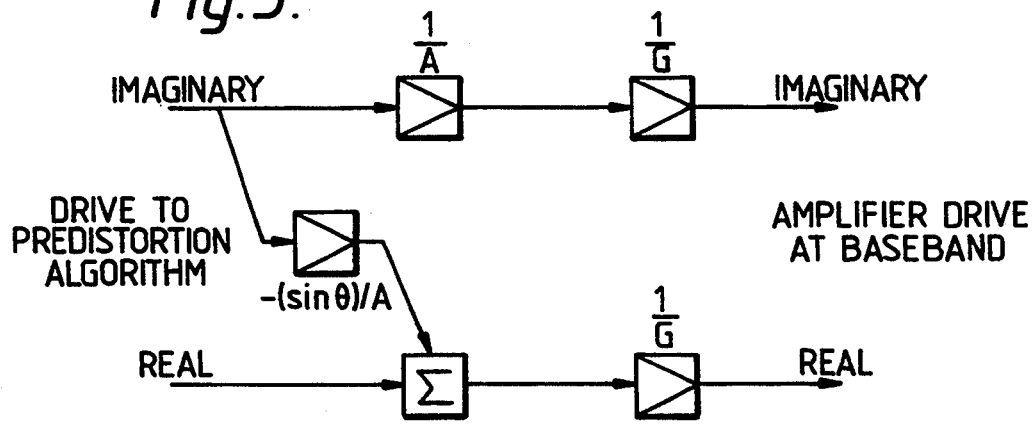
FIG. 5 illustrates a predistortion algorithm used in the embodiment of the invention of FIG. 1 to reduce gain and phase mismatch in the amplifier.
Figure 6:
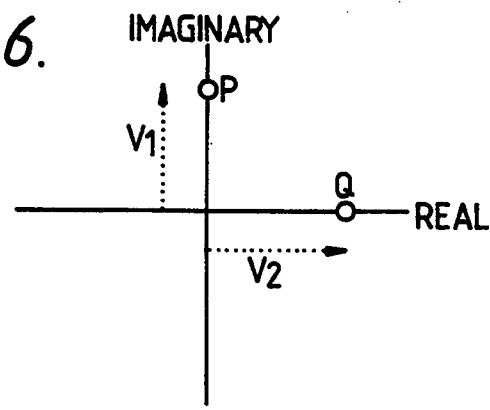
Figure 7:
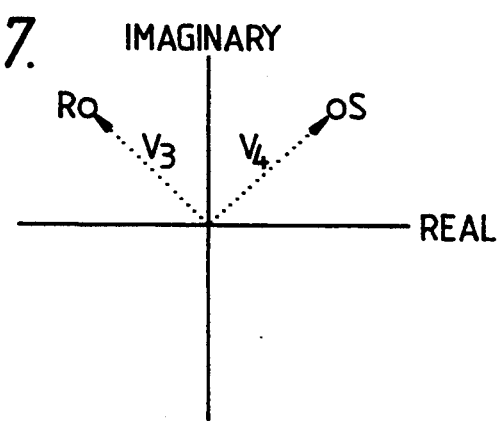
Figure 8:
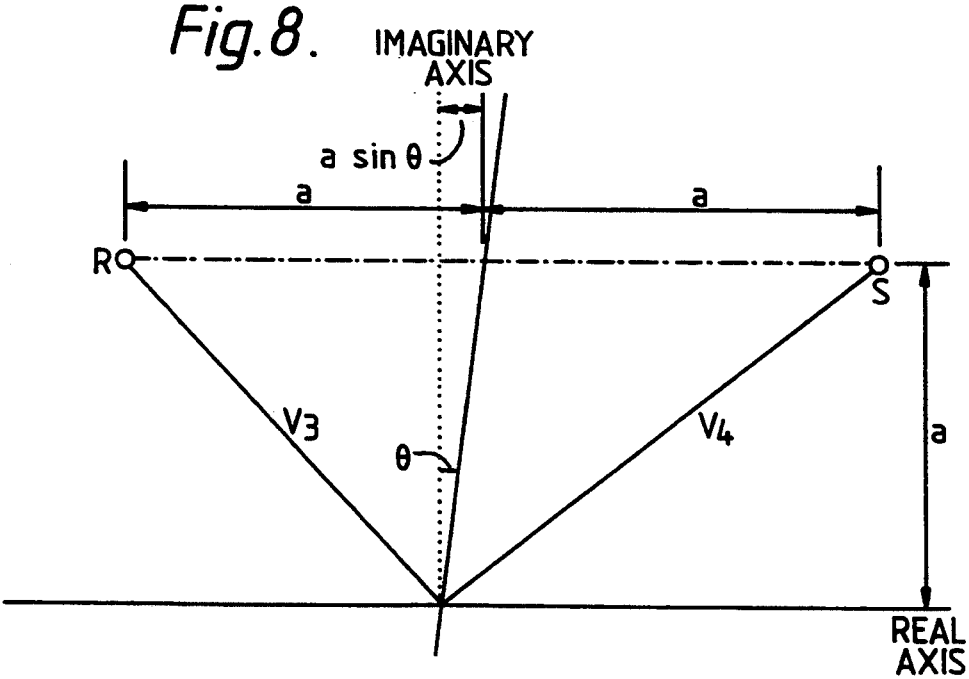

FIGS. 6 and 7 are Argand diagrams showing the nature of test signals used in the embodiment of FIG. 1 to determine the gain and phase mismatch, respectively; and FIG. 8 is a diagram illustrating the calculation of a phase correction factor from the amplitude of two test signals in the embodiment of FIG. 1; and FIGS. 9 through 17 illustrate the derivation of a set of three test signals which can be used in place of the five test signals used in the embodiment of FIGS. 1-8.

FIG. 1 illustrates, in block diagram form, a Cartesian loop amplifier embodying the present invention. An input signal to be transmitted is applied to the input terminal 2 of a signal pre-processor 3 (whose purpose and operation will be more fully described below) which when operating in a first, transmission mode, pre-processes the signal to apply a linearising pre-distortion to it and, resolves it into two quadrature ("real" and "imaginary") components in two separate channels which are then applied to respective forward paths 4A, 4B of an error amplifier 4. (The reference numerals associated with circuit elements of the "real" quadrature component signals have the suffix "A" and those of the "imaginary" quadrature component signals have the suffix "B"). As will become apparent from the following, the pre-processor 3 is also operable in a second, calibration, mode in which it applies a series of test signals to the two inputs of the forward paths 4A, 4B which are used to derive values used in pre-distorting the input signal to improve linearity. The outputs of the paths 4A and 4B are summed by a summing circuit 5 and then subjected to up-conversion to RF by a modulator 6. The up-conversion to RF can be either direct or via one or more stages of conversion via intermediate frequencies (IF). The form of RF signal is not directly relevant to the present invention, but it is noted that the embodiment of FIG. 1 was devised for production of a single sideband, suppressed carrier mobile radio signal.

The signal resulting from the frequency up conversion by item 6 is applied as the drive signal to the input of an RF power amplifier 7. The purpose of the Cartesian loop is to linearise the amplification of an input signal between the input to the pre-processor and the output of this power amplifier 7.

A directional coupler 8 is used to apply the output of amplifier 7 to an antenna 9 for transmission and to obtain a sample of the output which is used to drive the feedback part of the Cartesian loop.

This sampled signal is frequency down-converted back to baseband by a frequency down-converter 10 which may be implemented by any suitable demodulating circuitry and the resulting signal is then processed, by circuitry described below, so as to resolve it into two quadrature feedback signals which are used to apply respective corrections to the signals passing through the two parallel forward paths 4A, 4B of the error amplifier 4. As with the frequency up-conversion, the frequency down-conversion may be direct from RF to baseband or via one or more stages of intermediate frequency conversion. The demodulation needless to say, should be the inverse of the modulation applied in the up-conversion.

The two forward paths 4A, 4B include, as a first stage, amplifiers 12A, 12B which respectively receive the real and imaginary quadrature components of the preprocessed input signal from terminal 1 and the corresponding one of the two quadrature components from the feedback path 11 and produces an output equal to the difference between those components.

The difference signals for the real and imaginary components from the amplifiers 12A, 12B are applied to respective mixers 13A, 13B where they are mixed with signals derived from the output of a local oscillator 13.

The output of oscillator 13 passes through phase splitter 14 which divides the signal between the forward and reverse paths of the Cartesian loop. In the forward path, a phase shifter 15 provides compensation for delays around the Cartesian loop so that negative feedback at the error amplifier is ensured. The output from the phase shifter 15 passes through a 0°/90° phase shifter/splitter 16 so that the signals from amplifiers 12A and 12B are mixed with two sinusoidal signals from the output of oscillator 13 which are 90° phase shifted relative to one another. This achieves a quadrature up-conversion of the output of amplifiers 12A and 12B.

In the feedback path, the output of the frequency down-converter 10 is applied to the input of a 0°/0° phase splitter 17. The outputs from phase splitter 17 are applied to two mixers 18A, 18B where they are mixed with two signals, phase shifted 90° relative to one another derived by phase shifter/splitter 19 and phase splitter 14 from the local oscillator 13. The outputs of the mixers 18A, 18B are applied to the inverting inputs of amplifiers 12A, 12B, as representing quadrature components at baseband of the output of amplifier 7.

The sampled output from the directional coupler 8, in addition to being applied to the down-converter 10, is fed to a signal strength measurement circuit 20 to derive a signal representing the transmitted RF power. This signal is fed back to the pre-processor 3 for use in performing measurements. In practice, the pre-processor 3 may conveniently be implemented using a DSP (Digital Signal Processing) chip. In the following, for ease of understanding, the operation of the pre-processor 3 will be explained in terms of signal processing blocks.

The gain and phase shift that a Cartesian amplifier applies to two quadrature channels can be modelled by an equivalent signal flow diagram as shown in FIG. 4. The output of the amplifier is actually in the form of a single RF signal. In the diagram, this is resolved into real and imaginary quadrature components referenced to the RF carrier.

The amplifier drive signal is applied to a gain, G, which appears on both quadrature paths. This represents the gain of the amplifier. Quadrature mismatch appears as either an alteration in the gain of one of the quadrature paths relative to the other (represented by A) or as a phase shift away from the ideal 90 degree difference between the quadrature paths (this is represented by the sin $\theta$ cross addition, if $\theta$ is small).

To compensate for the quadrature mismatch modelled by FIG. 4, it is apparent that a predistortion algorithm as shown in FIG. 5 can be utilised. Such signal processing is easily achieved in DSP.

If an overall gain of one is required (for simplicity), then G is compensated for by predistorting both quadrature channels by 1/G. Gains other than unity can be achieved by amplifying the drive signal before it is applied to the signal preprocessor. Similarly, the gain mismatch caused by A is removed using a gain factor, 1/A, and the phase offset is removed by cross multiplying by a factor (-sin $\theta$)/A as shown.

This method for removing quadrature mismatch is suitable for fixed values of G, A and $\theta$. For any given amplifier this will reduce distortion to acceptable levels for a considerable time (under some conditions this would apply for weeks or even months). A method is, however, required for periodically calculating values for G, A and $\theta$. The key element of the techniques described here is the following method for calculating such predistortion factors.

The three predistortion factors can be calculated independently, so long as the correction achieved by each one is small. The calibration used to determine appropriate values for these factors involves applying a variety of test signals to the amplifier and monitoring the RF output signal using a separate signal strength measurement monitor 20 as shown in FIG. 1. Typically the monitor could be implemented using a simple envelope detector by rectifying the RF signal from a directional coupler connected to the output of the power amplifier and time averaging the result. Averaging would typically consist of a first order lowpass RC filter with a passband of 50kHz to produce a voltage representing the signal strength.

Figure 2:
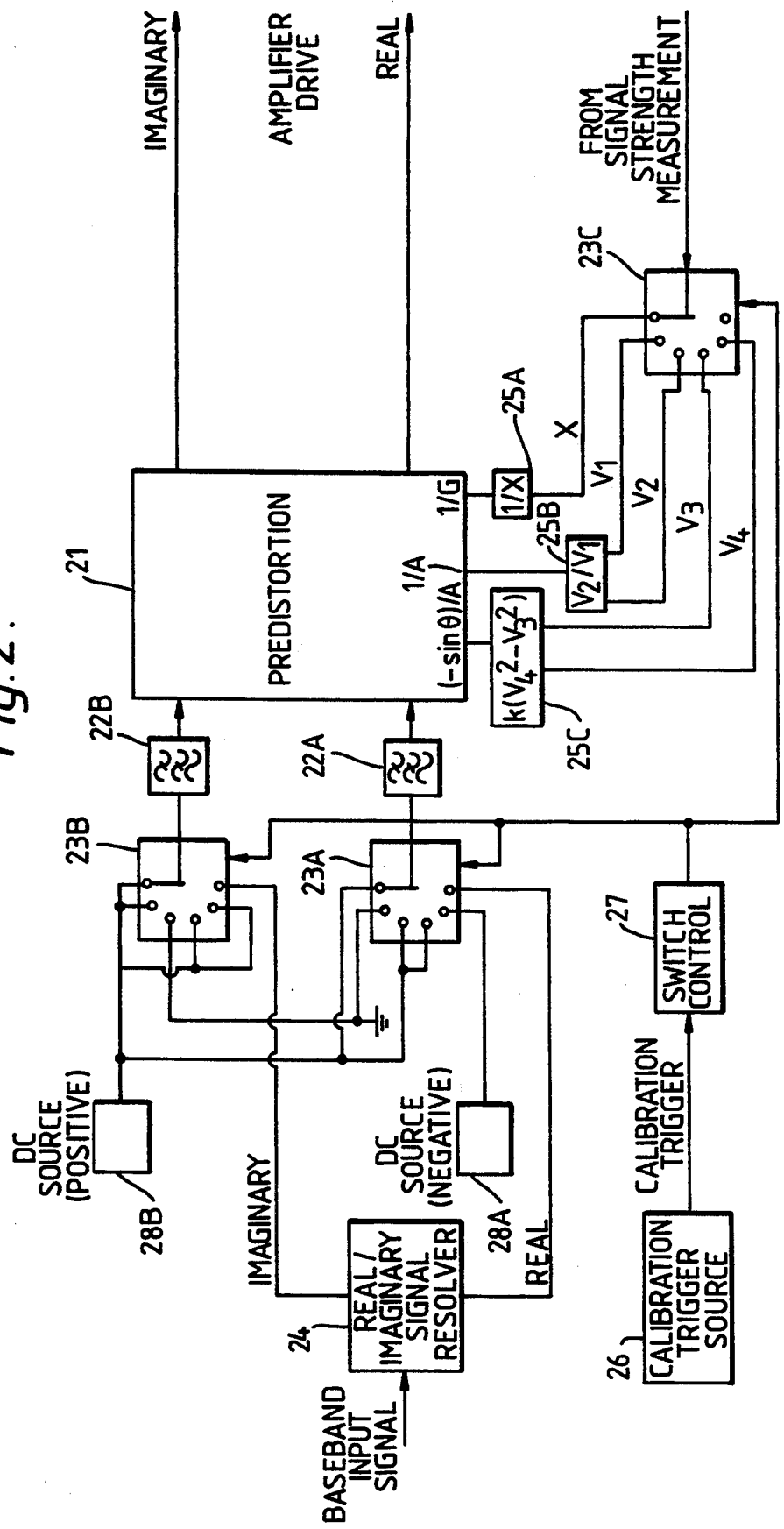
FIG. 2 is a block diagram of one implementation of the signal preprocessor shown in FIG. 1.
Figure 3:
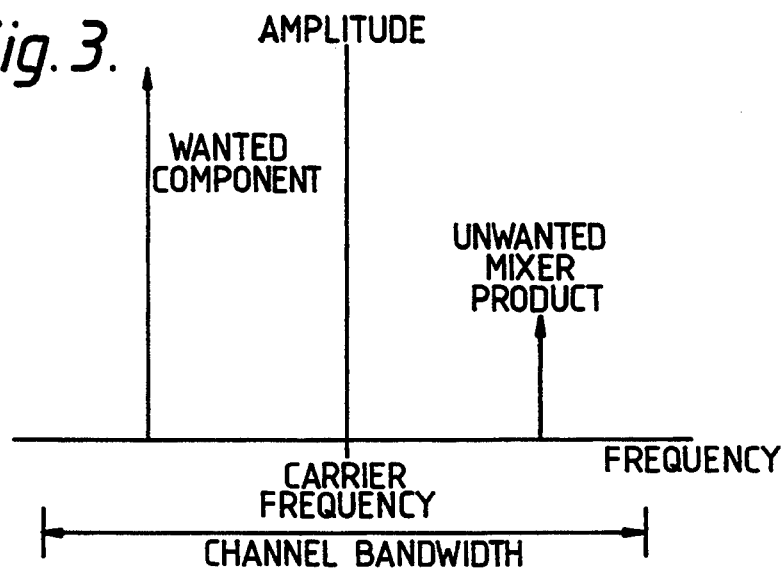
FIG. 3 illustrates the distortion artefact due to an unwanted mixer product caused by gain and phase mismatch in the amplifier (drive signal is a single tone)

The application of the test signals can be controlled as in FIG. 2 which shows an example implementation of the signal preprocessor. When a calibration trigger occurs, the three switches are rotated together by the switch control. The predistortion block (detailed in FIG. 5) is initialised to have no effect on the signal. As the different test signals are applied by the input switches, the feedback from the signal strength monitor is used to derive different parameters that are used by the predistortion block. Finally, the last switch position allows the wanted signal to be transmitted through the amplifier and represents the steady state mode of operation.

The first parameter, G, can be calculated by applying a simple calibration signal, such as a known DC level, into either (or both) of the inputs of the amplifier. This is the first position for the switches shown in FIG. 2. The RF output signal level can be measured and the true gain of the amplifier calculated, by comparison to the desired gain, a value for the gain factor, G, can be derived.

The second factor, A, can be calculated by applying two separated calibration signals to the Cartesian loop. The first consists of a known DC level on the imaginary path (represented by point P in FIG. 6). Similarly, the second consists of a known DC level on the real path (represented by point Q in FIG. 6). While each of the calibration signals is applied, the RF output level from the amplifier is measured. This gives rise to values $V_2$ and $V_1$ for the real and imaginary calibration signals respectively. It is then simple to calculate the factor A as $V_2/V_1$.

The final parameter, $\theta$, can be evaluated by transmitting two calibration signals. The first consists of a positive DC level on each of the two quadrature paths. This results in a signal at position S as represented on FIG. 7. The second calibration signal is the same except that one quadrature path is driven with an equivalent negative DC level as represented by point R on FIG. 7 (where the real signal is inverted).

Again, the RF output level from the amplifier is measured for each calibration signal, giving $V_3$ for point R and $V_4$ for point S. It is shown below that the phase offset, as represented by sin $\theta$, is proportional to $V_4^2 - V_3^2$. A constant of proportionality can be established by calibrating with a known phase offset during equipment development. Subsequently, during production and operation, the calibration can be fully automatic.

The existence of the relationship, $$\sin\theta \alpha V_4^2 - V_3^2$$

can be explained by considering FIG. 8. The phase shift that results in quadrature mismatch yields a rotation of the imaginary axis relative to the real axis by an angle $\theta$. The calibration signals used to drive the amplifier use the same DC levels on the two quadrature paths. This means that the distances defined by a in FIG. 8 are all equal. The compensation for phase offset requires calculation of sin $\theta$.

From FIG. 8 if $\theta$ is small:

$$\begin{aligned} V_3^2 &= a^2 + (a - a\sin\theta)^2 \\ &= 2a^2 - 2a^2\sin\theta + a^2\sin^2\theta \end{aligned}$$

also:

$$V_4^2 = 2a^2 + 2a^2 \sin\theta + a^2 \sin^2\theta$$

which can be combined to give:

$$V_4^2 - V_3^2 = 4a^2\sin\theta$$

$$\sin\theta = \frac{V_4^2 - V_3^2}{4a^2}$$

thus:

$$\sin\theta \propto V_4^2 - V_3^2$$

The calibration process thus consists of making three independent measurements of predistortion parameters. In one method of implementing the illustrated embodiment a total of five separate calibration signals are used to drive the amplifier to achieve this. Each signal must propagate through the transmitter, and the Cartesian loop must be allowed to settle before any measurement of RF output power is made. The time required is, however, typically small and calibration time is dominated by the delay through any channel filtering within the system. For example, a 25kHz channel bandwidth would incur a channel filter group delay of less than 0.1 mS. Thus the full calibration, including five outputs, could be achieved in less than 0.5 mS. In practice, delays in digital to analogue conversion and analogue to digital conversion as well as in the DSP may also be significant. In a 5kHz system using digital channel filtering, calibration has required 10mS delay through the channel filter.

In systems that include frequency synthesis, the phase noise of any local oscillators may be significant. Consider the phase noise power within the band of interest approaching the acceptable level of unwanted sideband after the quadrature matching has been calibrated. The phase noise will then appear in the RF output level monitor as an unwanted error in the measurement. Experience has shown that the level of phase noise must be several decibels lower than the required level of unwanted image sideband if calibration is to be successful.

To achieve better calibration, the phase noise must be filtered from the RF output monitor signal. Such filtering extends the time that the calibration signals must be held on the amplifier input and thus increases the total time required for calibration.

A final consideration is the interval between calibrations. As calibration does require power to be output from the amplifier, the radio system as a whole must make provision for short transmissions of test signals.

Typically, the gain and phase accuracy does not drift quickly with either temperature or supply variation. It is possible to operate with a single calibration on power up, or once in several hours, while still achieving unwanted sideband rejection better than 40dB.

FIG. 2 illustrates in more detail one possible implementation of the signal preprocessor 3 which would be implemented via DSP but is here illustrated in block form. A predistortion circuit 21 receives real and imaginary signal components at baseband via low pass filters 22A,22B which limit the maximum bandwidth of the test signals, predistorts them according to the three correction factors $(-\sin\theta)/A$, $1/A$ and $1/G$ and delivers the resulting output to the differential amplifiers 12A,12B of the error amplifier 4.

A three pole six way, ganged electronic switch 23A,23B,23C, is used to determine the signals applied to the filters 22A, 22B and to the distortion-factor control inputs of the pre-distortion circuit 21. In the normal, transmit mode, the real and imaginary components of the input signal resolved by resolver circuit 24 are applied via the lowermost poles of the switches 23B,23A to the filters 22B,22A.

In the calibration mode, the switch controller 27 steps the switches 23A–C in sequence through their five other positions while test signals are applied to the filters 22A,22B and correction factor calculations are performed by calculating circuits 25A,25B,25C which receive the RF signal strength measurement signal from circuit 20.

In FIG. 2 the entry into the calibration mode is started by a signal applied from calibration trigger circuit 26 at power up and/or at suitable intervals during operation of the apparatus, for which purpose circuit 26 may incorporate a suitable timer; the switch control circuit incorporate the timing and sequencing logic necessary to step the switches 23A–C through their five calibration positions at an appropriate rate.

The test signal sources are simply positive and negative DC reference voltage sources 28A,28B.

In the following, the stationary poles of the three switches 23A–C will be referred to by number in counter clockwise position order.

In position 1, the positive DC reference from source 28B is applied to both filters 22 and the correction factor calculation circuit 25A calculates the factor $1/G$.

In position 2, filter 22B receives the DC reference from source 28B while the input to filter 22A is grounded. In this position, calculating circuit 25B samples and holds the value $V_1$.

In position 3, the input to filter 22B is grounded and filter 22A receives the positive DC reference. Calculating circuit 25B samples and holds value $V_2$. At the end of the position 3 period circuit 25B calculates $V_2/V_1$ and applies the result to the $1/A$ correction factor input to predistortion circuit 21.

In position 4, filters 22A and B both receive the positive DC reference voltage, and calculating circuit 25C measures the value $V_3$.

In position 5, filter 22B continues to receive the positive DC reference while filter 22A receives the negative DC reference from source 28A; circuit 25C measures the value $V_4$. At the end of operation in this position, circuit 25C calculates K $(V_4^2 - V_3^2)$ and applies this to the $(-\sin\theta)/A$ correction factor input of predistortion circuit 21. After that, operation reverts to the normal, transmit, mode (switch position 6) with the predistortion circuit 21 predistorting the real and imaginary components of the signal to be transmitted using the correction factor values so derived.

Internally, the predistortion circuit 21 implements the algorithm illustrated in FIG. 5: the imaginary component is a) successively multiplied, by suitable controllable variable gain blocks, by the factors $1/A$ and $1/G$ and outputted to the forward imaginary signal channel and b) multiplied, using a controllable gain block by the factor $(-\sin\theta)/A$ and then summed with the input real component, the resulting sum being multiplied by a controllable gain block by the factor $1/G$ to form the output applied to the differential amplifier of the real component channel of the error amplifier 4.

FIGS. 9 through 17 illustrate the derivation of a set of just three calibration signals which can be used in the embodiment of FIGS. 1–8.

The following analysis is based upon the simplifying assumptions that the inequality $|K|\cdot|H| \gg 1$ hold and that the optional frequency up/down conversion holds. In the inequality, K represents the forward gain in the up-converter of the Cartesian loop, while H represents the reverse gain in the downconverter.

Figure 9:
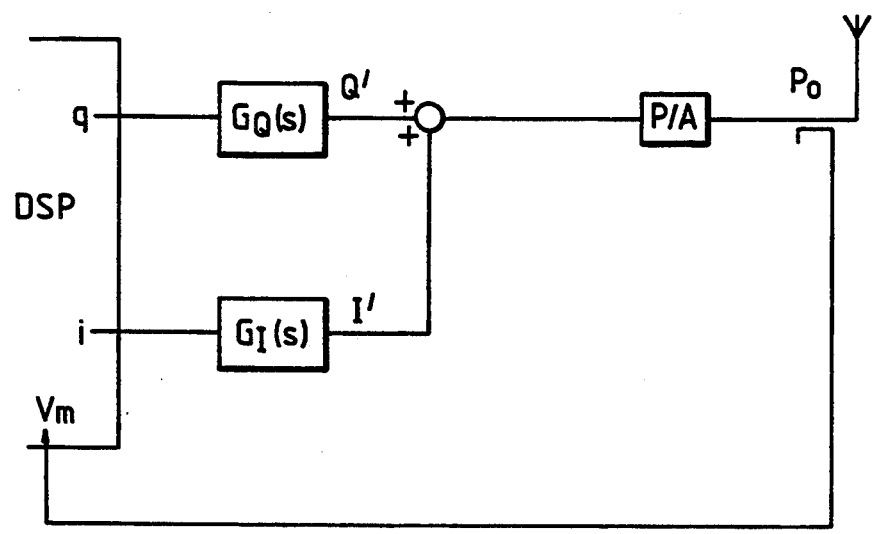

Referring now to FIG. 9, this reproduces the salient parts of FIG. 1, with frequency up/down conversion omitted, and with the transfer functions of the forward paths for the two quadrature component signals, here designated q and i, by transfer functions $G_Q(s)$ and $G_I(s)$, respectively.

In FIG. 9, Q' and I' are the actual signals out of $G_Q$ and $G_I$, respectively, and may not be in exact quadrature unless $G_Q \equiv G_I$ at all frequencies of interest (for example ±2.5 kHz in the case of a 5 kHz wide radio channel). i.e. the gain and phase responses of $G_Q$ and $G_I$ ideally need to be in track over the frequency band.

However, given sufficient loop bandwidth ($\approx$ 30 kHz in the example just mentioned of a 5 kHz radio channel), if $G_Q$ and $G_I$ are equalised at zero frequency they are likely to remain adequately in track.

Figure 10:
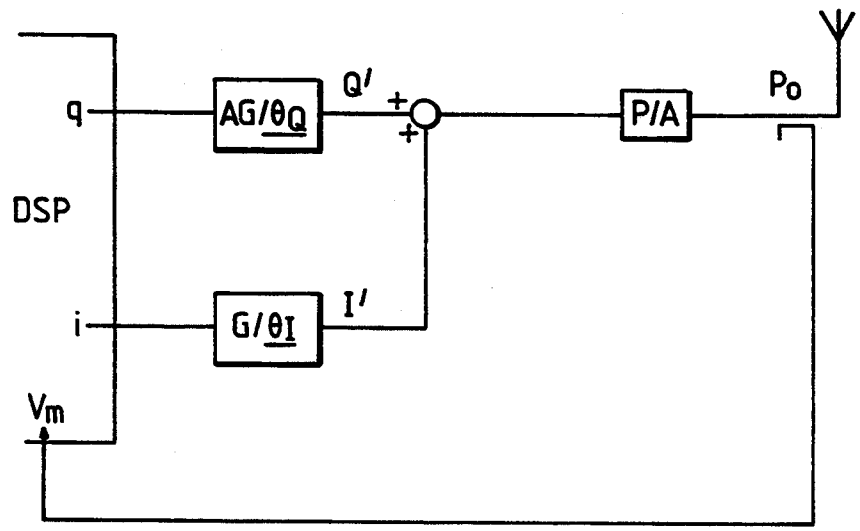
Figure 11:
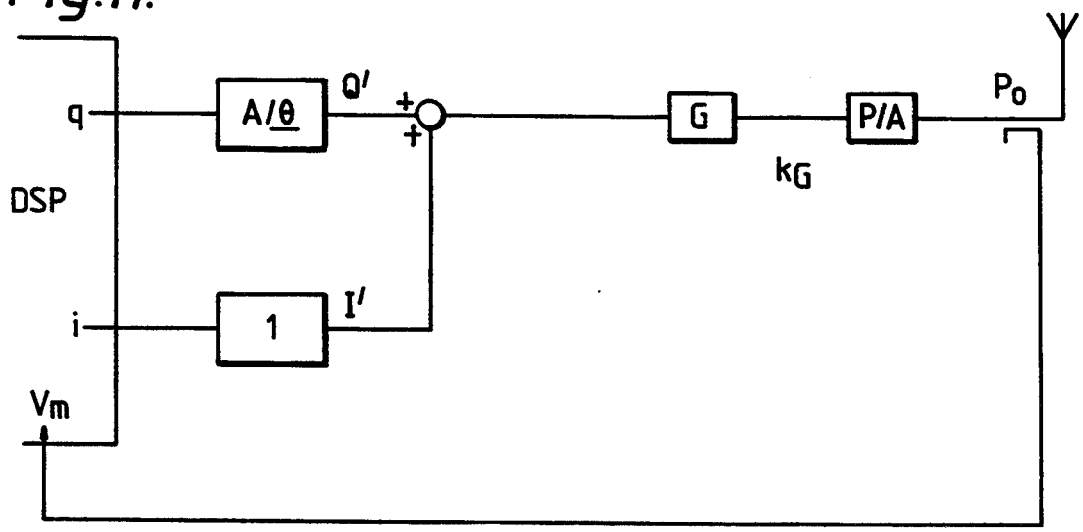

A low frequency representation corresponding to FIG. 9 is shown in FIG. 10, in which $$AG \equiv |G_Q| \quad \theta_Q \equiv \angle G_Q$$
$$G \equiv |G_I| \quad \theta_I \equiv \angle G_I$$

(A=constant$\approx$1)

FIG. 11c illustrates the further simplification which can be used where $\theta << \pi/2$.

FIG. 12d represents the axes of the i and q signals.

From FIGS. 11c and 12d, the actual in-phase (I) and quadrature (Q) components of P are:

$$Q = Q' \cos\theta = Q'\left(1 - \frac{\theta^2}{2!} \cdots\right) \quad (1)$$

i.e $Q \approx Q'$ $$\therefore Q = Aq$$

and $$I = I' + Q'\sin\theta = I' + Q'\left(\theta - \frac{\theta^3}{3!} \cdots\right) \quad (2)$$
$$= I' + Q'\theta$$

$$\therefore I = i + A\theta q$$

It can be seen from (1) that Q is in error by a scale factor A and from (2) that I is in error by the cross-coupling factor $A\theta$ from the quadrature drive, q.

FIG. 13e corresponds to FIG. 11c, redrawn to show the scale- and cross-coupling errors In FIG. 13

$$V_m^2 \equiv K_m P_o \quad (3)$$

where $P_0$ is the output power.

From FIG. 13e (or equations (1) and (2)):

$$P_o = k_G P = k_G(I^2 + Q^2) \quad \text{noting that } I \text{ and } Q \quad (4)$$
$$\text{are strictly orthogonal}$$

hence, $$P_o = k_G[(i + A\theta q)^2 + (Aq)^2]$$
$$= k_G[i^2 + A^2q^2 + 2A\theta iq] + O(\theta^2)$$

-continued from (3) $V_m^2 = k_m P_o$ $$\therefore V_m^2 = k[i^2 + A^2q^2 + 2A\theta iq]$$

Where $k \equiv k_G k_m$

From equation (4) K, a, $\theta$ can be derived through the use of three pairs of calibration signals for i and q and measuring the resulting $V_m (=V_a, V_G, V_C)$.

Calibration Signal

Case (a): i=a, q=0
Case (b): i=0, q=a
Case (c): i=a, q=a

These calibration signals are shown in FIGS. 14, through 16 and as in the five signal case, can simply be DC reference levels, though of course any other suitable signals may be used.

FIG. 14
$$V_a^2 = ka^2 \quad (5)$$
$$\therefore k = V_a^2/a^2$$

FIG. 15
$$V_b^2 = kA^2a^2 \quad (6)$$
$$= \frac{V_a^2}{a^2} \cdot A^2 a^2$$

$$\therefore A = \frac{V_b}{V_a}$$

FIG. 16
$$V_c^2 = k[a^2 + A^2a^2 + 2A\theta a^2] \quad (7)$$

$$\therefore V_c^2 = ka^2[1 + A^2 + 2A\theta]$$
$$= \frac{V_a^2}{a^2} a^2 [1 + A^2 + 2A\theta] \quad (k \text{ from (5)})$$

$$\therefore \frac{V_c^2}{V_a^2} = 1 + A^2 + 2A\theta \quad \text{(then substitute for } A \text{ from(6))}$$

$$\therefore \theta = \frac{V_a}{2V_b}\left[-1 - \frac{V_b^2}{V_a^2} + \frac{V_c^2}{V_a^2}\right]$$

Hence k, A and $\theta$ may be identified by the three measurements of $V_m$, using the selected simple test functions.

Consequently, it is then possible to pre-distort the "live" i and q signals (to give i' and q') such that the i' and q' guarantee the outputs I and Q to be orthogonal, as shown in FIGS. 14 through 16.

FIGS. 1 to 13 and the corresponding description indicate two practical implementations of the invention. Those skilled in the art will appreciate that the invention is not limited to the implementational details of the embodiment shown and that numerous variations are possible without departing from the scope of the present invention. In particular, the invention is not limited to the particular calibration techniques used to derive the three correction factors nor the particular illustrated implementation of the signal preprocessor and predistortion algorithm.

We claim:

1. A Cartesian amplifier system comprising:
   an input for an input signal to be amplified;
   a power amplifier, having an output, for amplifying the input signal;

means for resolving said input signal into "real" and "imaginary" components;

a Cartesian loop feedback circuitry around the power amplifier having a pair of channels for processing "real" and "imaginary" quadrature signal components, means for summing said processed real and imaginary signals, and means to drive the power amplifier with one or more feedback signals derived from the summed real and imaginary signals from the respective outputs of forward paths of those channels, wherein the amplifier system is operative in a first, normal mode to amplify the input signal and a second, calibration mode to apply test signals to drive the Cartesian loop in place of the input signal;

wherein the amplifier system comprises means for measuring the response of the Cartesian loop to the test signals and for calculating and setting a value or values of at least one predistortion factor, and means for measuring the response of the Cartesian loop by measuring the signal strength at the output of the power amplifier while the system is operated in the second, calibration mode; and wherein the Cartesian loop comprises, or is associated with, a signal pre-processor for pre-distorting resolved real and/or imaginary components of the input signal in accordance with the value or values of the at least one predistortion factor.

2. A system according to claim 1, wherein the Cartesian loop includes an error amplifier for said pair of channels for amplifying the differences between i) the real components and imaginary components, respectively of the resolved input signal from the pre-processor and ii) respective ones of said one or more feedback signals, a plurality of inputs to said error amplifier, and means for obtaining real and imaginary components of the amplified signal for said respective feedback signals to be applied to the inputs of the error amplifier.

3. A system according to claim 2, wherein said means for obtaining components comprises resolving means for resolving the summed output of the power amplifier.

4. A system according to claim 3 wherein the power amplifier is an RF power amplifier, and the Cartesian loop further comprises a frequency up-converter for converting the outputs of real and imaginary channels of the error amplifier to RF to drive the power amplifier, and a frequency down-converter for frequency downconverting the output of the power amplifier to baseband prior to said output being resolved.

5. A system according to claim 4 wherein said differences amplified by said error amplifier are between the components and said respective feedback signals at baseband.

6. A system according to claim 5, wherein the preprocessor is operative to correct for imbalances in the real and imaginary channels of the feedback signals.

7. A system according to claim 1 wherein the test signals include, or consist of, predetermined DC voltage levels applied in a number of combinations to the real and imaginary channels of the signal preprocessor.

8. A system according to claim 7 wherein said at least one predistortion factor includes a factor which compensates for gain mismatch between the paths of said pair of channels and a factor which compensates for a relative phase shift which occurs between the two channels through the power amplifier.

9. A system according to claim 6 wherein the test signals include, or consist of, predetermined DC voltage levels applied in a number of combinations to the real and imaginary channels of the signal preprocessor.

10. A system according to claim 9 wherein said at least one predistortion factor includes a factor which compensates for gain mismatch between the paths of said pair of channels and a factor which compensates for a relative phase shift which occurs between the two channels through the power amplifier.

11. A system according to claim 1 wherein the preprocessor is implemented using a digital signal processor.

12. A system according to claim 1 wherein said signal strength is measured at the output of the power amplifier.

13. A system according to claim 1 wherein said calibration mode is set upon power-up.

14. A system according to claim 1 wherein said signal strength is measured using a directional coupler.

15. A system according to claim 7 wherein five calibration signals are used, namely
  a) a predetermined signal level applied to at least one of the quadrature channels and used to determine the gain;
  b) respective predetermined signal levels applied to the quadrature channels and used to determine a factor representing the gain mismatch between the channels;
  c) respective predetermined signal levels applied to the quadrature channels and used to determine the phase mismatch from quadrature between the two channels.

16. A system according to claim 7, wherein three sets of calibration signals are used, namely
  a) first and second predetermined signal levels applied to respective ones of the quadrature channels;
  b) the first and second predetermined signal levels each applied to the other of the quadrature channels;
  c) a third predetermined signal level applied to both quadrature channels.

* * * * *

UNITED STATES PATENT AND TRADEMARK OFFICE
CERTIFICATE OF CORRECTION

PATENT NO. : 5,381,108
DATED : January 10, 1995
INVENTOR(S) : Whitmarsh, et al

It is certified that error appears in the above-indentified patent and that said Letters Patent is hereby corrected as shown below:

Column 9, line 14, "$G_I$ideally" should be --$G_I$ ideally--.

Column 9, line 30, "11c and 12d" should be --11 and 12--.

Column 9, line 51, "13e" should be --13--.

Column 9, line 5, "11c" should be --11--.

Column 9, line 55, "K" should be --k--.

Column 9, 58, "13e" should be --13--.

Signed and Sealed this

Twenty-first Day of March, 1995

Attest:

BRUCE LEHMAN

*Attesting Officer*  *Commissioner of Patents and Trademarks*